US009425232B2

(12) United States Patent
Mitra

(10) Patent No.: US 9,425,232 B2
(45) Date of Patent: Aug. 23, 2016

(54) VERY SMALL PIXEL PITCH FOCAL PLANE ARRAY AND METHOD FOR MANUFACTURING THEREOF

(71) Applicant: DRS Network & Imaging Systems, LLC, Melbourne, FL (US)

(72) Inventor: Pradip Mitra, Colleyville, TX (US)

(73) Assignee: DRS Network & Imaging Systems, LLC, Melbourne, FL (US)

( * ) Notice: Subject to any disclaimer, the term of this patent is extended or adjusted under 35 U.S.C. 154(b) by 0 days.

(21) Appl. No.: 15/045,139

(22) Filed: Feb. 16, 2016

(65) Prior Publication Data
US 2016/0163757 A1 Jun. 9, 2016

Related U.S. Application Data

(62) Division of application No. 14/139,071, filed on Dec. 23, 2013, now Pat. No. 9,293,497, which is a division of application No. 12/241,649, filed on Sep. 30, 2008, now Pat. No. 8,634,005.

(51) Int. Cl.
*H01L 27/146* (2006.01)
(52) U.S. Cl.
CPC .... *H01L 27/14636* (2013.01); *H01L 27/14645* (2013.01)
(58) Field of Classification Search
CPC .................. H01L 27/14636; H01L 27/14687
USPC .................................. 257/292–294, 431–448
See application file for complete search history.

(56) References Cited

U.S. PATENT DOCUMENTS 4,245,274 A   1/1981   MacDonald et al.
4,686,373 A   8/1987   Tew et al.
(Continued)

FOREIGN PATENT DOCUMENTS

JP   2006-021503 A   1/1994
WO   2010/039710 A1   4/2010

OTHER PUBLICATIONS

Notification of Transmittal of the International Search Report and the Written Opinion of the International Searching Authority, or the Declaration and International Search Report and Written Opinion of the International Searching Authority for International Application No. PCT/US2009/058790 mailed on Jan. 13, 2010, 7 pages.

(Continued)

*Primary Examiner* — Cuong Q Nguyen
(74) *Attorney, Agent, or Firm* — Kilpatrick Townsend & Stockton LLP

(57) ABSTRACT

An imaging device includes a first semiconductor layer having a first surface and a second surface and a first photodetector having a first implanted region formed in the first semiconductor layer and a pad formed over the first implanted region. The imaging device also includes a readout circuit disposed over the first surface of the first semiconductor layer. The readout circuit has a plurality of contact plugs facing the first surface of the first semiconductor layer. The imaging device further includes a second semiconductor layer disposed below the second surface of the first semiconductor, a second photodetector having a second implanted region formed in the second semiconductor layer, and a metalized via extending through the first semiconductor layer and the second semiconductor layer and electrically connecting the second implanted region to a second of the contact plugs of the readout circuit.

8 Claims, 8 Drawing Sheets

(56) References Cited

U.S. PATENT DOCUMENTS

| | | | |
|---|---|---|---|
| 6,346,700 B1 | 2/2002 | Cunningham et al. | |
| 7,045,761 B2 | 5/2006 | Hunt | |
| 7,355,222 B2 * | 4/2008 | Wells | H01L 27/14603 |
| | | | 257/222 |
| 8,634,005 B2 | 1/2014 | Mitra | |
| 8,946,610 B2 | 2/2015 | Iwabuchi et al. | |
| 9,093,350 B2 | 7/2015 | Endo et al. | |
| 2003/0022546 A1 | 1/2003 | Solomich et al. | |
| 2004/0245592 A1 | 12/2004 | Harmon et al. | |
| 2005/0185268 A1 | 8/2005 | McGettigan et al. | |
| 2007/0051991 A1 | 3/2007 | Hun | |
| 2008/0074728 A1 | 3/2008 | Ogikubo et al. | |
| 2008/0083939 A1 * | 4/2008 | Guidash | H01L 27/14634 |
| | | | 257/292 |
| 2008/0210939 A1 | 9/2008 | Chevrier et al. | |
| 2010/0019340 A1 * | 1/2010 | Shibayama | H01L 27/14618 |
| | | | 257/434 |

OTHER PUBLICATIONS

Non-Final Office Action for U.S. Appl. No. 12/241,649 mailed on Mar. 18, 2011, 13 pages.

Final Office Action for U.S. Appl. No. 12/241,649 mailed on Apr. 19, 2012, 12 pages.

Non-Final Office Action for U.S. Appl. No. 12/241,649 mailed on Sep. 27, 2012, 24 pages.

Notice of Allowance for U.S. Appl. No. 12/241,649 mailed on Sep. 13, 2013, 9 pages.

Notice of Allowance for U.S. Appl. No. 14/139,071 mailed on Nov. 20, 2015, 9 pages.

* cited by examiner

```
┌─────────────────────────────────────────────────────────────┐
│ Form or provide a readout circuit having first side and a   │
│ contact plug for each pad, the contact plug having a base   │─ 218
│ affixed to the first side and a plurality of prongs         │
│ extending from the base away from the first side            │
└─────────────────────────────────────────────────────────────┘
                              │
                              ▼
┌─────────────────────────────────────────────────────────────┐
│ Form or provide a second pair of stop elements on the first │
│ side of the readout circuit so that the base of each contact│─ 220
│ plug is disposed between the second pair of stop elements   │
│ and in substantial axial alignment with the first pair of   │
│ stop elements, each of the second pair of stop elements     │
│ having a third thickness                                    │
└─────────────────────────────────────────────────────────────┘
                              │
                              ▼
┌─────────────────────────────────────────────────────────────┐
│ Move the first side of the readout circuit towards the      │
│ substrate in substantial axial alignment with the first and │─ 222
│ second stop elements such that the prongs of the contact    │
│ plug are pressed into the pad and displace a portion thereof│
│ into a space between the prongs                             │
└─────────────────────────────────────────────────────────────┘
                              │
                              ▼
┌─────────────────────────────────────────────────────────────┐
│ Continue to move the first side of the readout circuit      │
│ towards the substrate in substantial axial alignment with   │
│ the first and second pairs of stop elements until the first │─ 224
│ pair of stop elements contacts the second pair of stop      │
│ elements; the combined thickness of the first and second    │
│ pair of stop elements being more than the length (L) of     │
│ each prong such that the prongs are inhibited from passing  │
│ completely through the pad.                                 │
└─────────────────────────────────────────────────────────────┘
                              │
                              ▼
┌─────────────────────────────────────────────────────────────┐
│ Inject or wick epoxy into a cavity defined by at least two  │
│ of the pad, a first of the first pair of stop elements, one │─ 226
│ of the second pair of stop elements in contact with the     │
│ first stop element, the initial passivation layer and the   │
│ first side of the readout circuit                           │
└─────────────────────────────────────────────────────────────┘
                              │
                              ▼
                          ( END )
```

*FIG. 2B*

VERY SMALL PIXEL PITCH FOCAL PLANE ARRAY AND METHOD FOR MANUFACTURING THEREOF

CROSS-REFERENCES TO RELATED APPLICATIONS

This application is a divisional of U.S. patent application Ser. No. 14/139,071, filed Dec. 23, 2013, which is a divisional of U.S. patent application Ser. No. 12/241,649, filed Sep. 30, 2008, now U.S. Pat. No. 8,634,005, the disclosures of which are hereby incorporated by reference in their entirety for all purposes.

FIELD OF THE INVENTION

The present invention relates to imaging devices. More particularly, the present invention relates to an imaging device having a focal plane array with a readout circuit and method of manufacturing thereof, where each pixel of the focal plane array has a very small pitch with dimensions corresponding to the cutoff wavelength of the photodetector of the respective pixel.

BACKGROUND OF THE INVENTION

The image resolution that can be achieved from conventional infrared focal plane arrays (IR FPA), even with the most favorable optics, are generally limited by the pixel pitch. In the most advanced conventional FPAs, the smallest pixel pitch dimensions are 12 microns for mid wavelength (MW) IR with a nominal cutoff wavelength of 5 microns. In the long wavelength (LW) IR bands with cutoff wavelengths of around 10 microns, the smallest pixel pitch observed by the applicant for conventional FPAs is 15 microns.

To enhance and further optimize image resolution, the pixel pitch of an FPA for an imaging device or photodetector needs to be comparable to the wavelength of radiation being detected. Among the primary limitations in reducing the pixel pitch of conventional imaging devices or photodetectors are the architecture of the FPA and associated readout circuit contacts and the fabrication technique for electrical interconnection of the FPA to the unit cells of the associated readout circuit. These limitations are especially compelling for the shorter wavelength IR bands with cutoff wavelengths of 2.5 microns or less.

Using high density vertically integrated photodiode (HD-VIP®, a trademark of DRS Technologies, Inc.) architecture, a pixel pitch as small as 6 microns and via diameters as small as 2 microns are practically feasible. With these dimensions, fill factors of approximately 90% may be realized. FIG. 1 shows the variation in fill factor versus pixel pitch for an FPA implementing pixels with HDVIP® architecture and having one of three different values of via diameters. As shown in FIG. 1, for smaller pixel pitches (e.g., less than 6 microns), the fill factor drops rapidly even for a via diameter of 2 microns and, thus, compromises the overall photodetector performance.

There is therefore a need for an FPA with associated readout circuit contact architectures and fabrication techniques that enables the realization of imaging devices with pixel pitches approaching the wavelength of radiation to be detected without compromising the fill factor of each photodetector. This is especially a stressing requirement for the short wavelength or SWIR spectral band with cutoff wavelengths ≤2.5 microns. In addition to image resolution, smaller pixel pitch IR FPAs enable reduced size of optics, reduced cooling requirements, which in turn leads to a smaller package, lower power consumption and reduced overall weight.

SUMMARY OF THE INVENTION

In accordance with systems and articles of manufacture consistent with the present invention, an imaging device having an improved focal plane architecture is provided. The imaging device comprises a semiconductor layer (such as an semiconductor infrared absorbing layer) and a photodetector having an implanted region formed in the semiconductor layer to define a p-n (or n-p) junction therein, and a pad formed or deposited over the implanted region. The pad has a malleable metal or metallic material, such as Indium. The imaging device further comprises a readout circuit having a contact plug. The contact plug has a base and a prong extending from the base and into the malleable metallic material of the pad. In one implementation, the prong is a first of a plurality of prongs extending from the base and into the malleable metallic material of the pad. The prongs have a structure effective to displace a portion of the malleable metallic material into a space between the first prong and a second of the prongs.

In addition, in accordance with methods consistent with the present invention, a method is provided for manufacturing an imaging device. The method comprises forming a contact pad having a malleable metallic material over a surface of a semiconductor substrate (e.g., such the pad is formed over the surface of a photodetector formed in the semiconductor substrate), and providing a readout circuit having a first side and a contact plug. The contact plug has a base affixed to the first side of the readout circuit and a plurality of prongs extending from the base away from the first side. The method further comprises moving the first side of the readout circuit towards the substrate surface so that the prongs of the contact plug are pressed into the pad and displace a portion of the pad into a space defined by and between a first and a second of the prongs.

In one implementation, the method further comprises: forming a first pair of stop elements over the semiconductor substrate surface so that the contact pad is disposed between the first pair of stop elements; and providing a second pair of stop elements on the first side of the readout circuit so that the base of each contact plug is disposed between the second pair of stop elements and in substantial alignment with the first pair of stop elements formed over the substrate surface. In this implementation, the first side of the readout circuit is moved towards the substrate surface in substantial axial alignment with the first and second pairs of stop elements until the first pair of stop elements contacts the second pair of stop elements. A first of the first pair of stop elements and a first of the second pair of stop elements have a combined thickness that is more than a length of each prong such that the prongs are inhibited from passing completely through the contact pad when the first pair of stop elements contacts the second pair of stop elements.

In accordance with systems and articles of manufacture consistent with the present invention, another imaging device having an improved focal plane architecture and effective to provide two color detection is provided. The imaging device comprises a first semiconductor layer having a first surface and a second surface; and a first photodetector having a first implanted region formed in the first semiconductor layer and a pad formed over the first implanted region. The pad has a malleable metallic material. The imaging device also comprises a readout circuit disposed over the first surface of the first semiconductor layer. The readout circuit has a plurality of contact plugs facing the first surface of the first semiconductor layer. A first of the contact plugs has a first base and a first prong extending from the first base and into the malleable metallic material of the pad of the first photodetector. The imaging device further comprises a second semiconductor layer disposed below the second surface of the first semiconductor and a second photodetector having a second implanted region formed in the second semiconductor layer. In addition, the imaging device has a metalized via extending through the first semiconductor layer through an insulated via and the second semiconductor layer so that the metalized via electrically only connects the second implanted region of the second photodetector to a second of the contact plugs of the readout circuit, enabling the imaging device to detect two wavelength bands or two portions of a band (e.g., two colors of the visible band or infrared band).

Other systems, methods, features, and advantages of the present invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings:

FIGS. 2A-2B show a flow chart depicting a process for manufacturing an imaging device in which a photodetector array and a ROIC are aligned and interconnected in accordance with the present invention;

DETAILED DESCRIPTION OF SPECIFIC EMBODIMENTS

Reference will now be made in detail to an implementation in accordance with methods, systems, and products consistent with the present invention as illustrated in the accompanying drawings.

Figure 1:
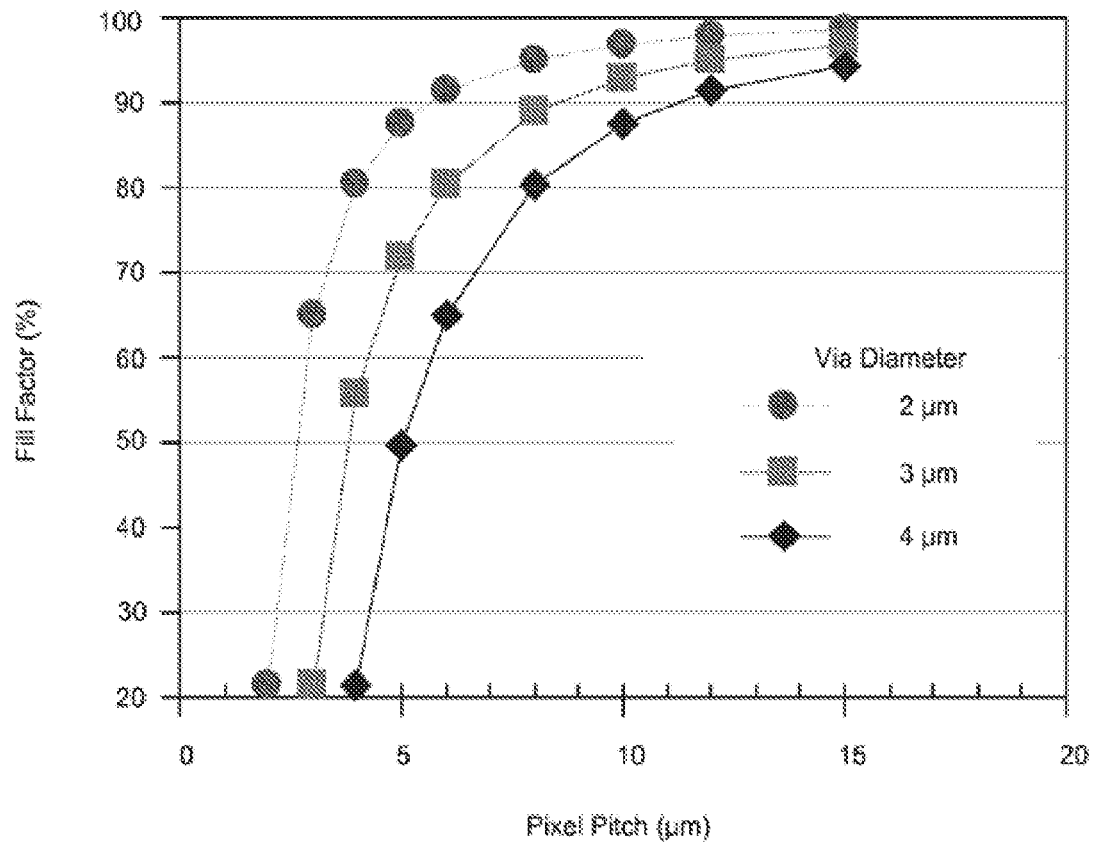
FIG. 1 is a graph depicting the variation in the fill factor percentage of a conventional HDVIP® photodetector of a pixel as a function of the pixel's pitch for three different "via" diameters for various pixel pitch on a focal plane array (FPA)
Figure 2A:
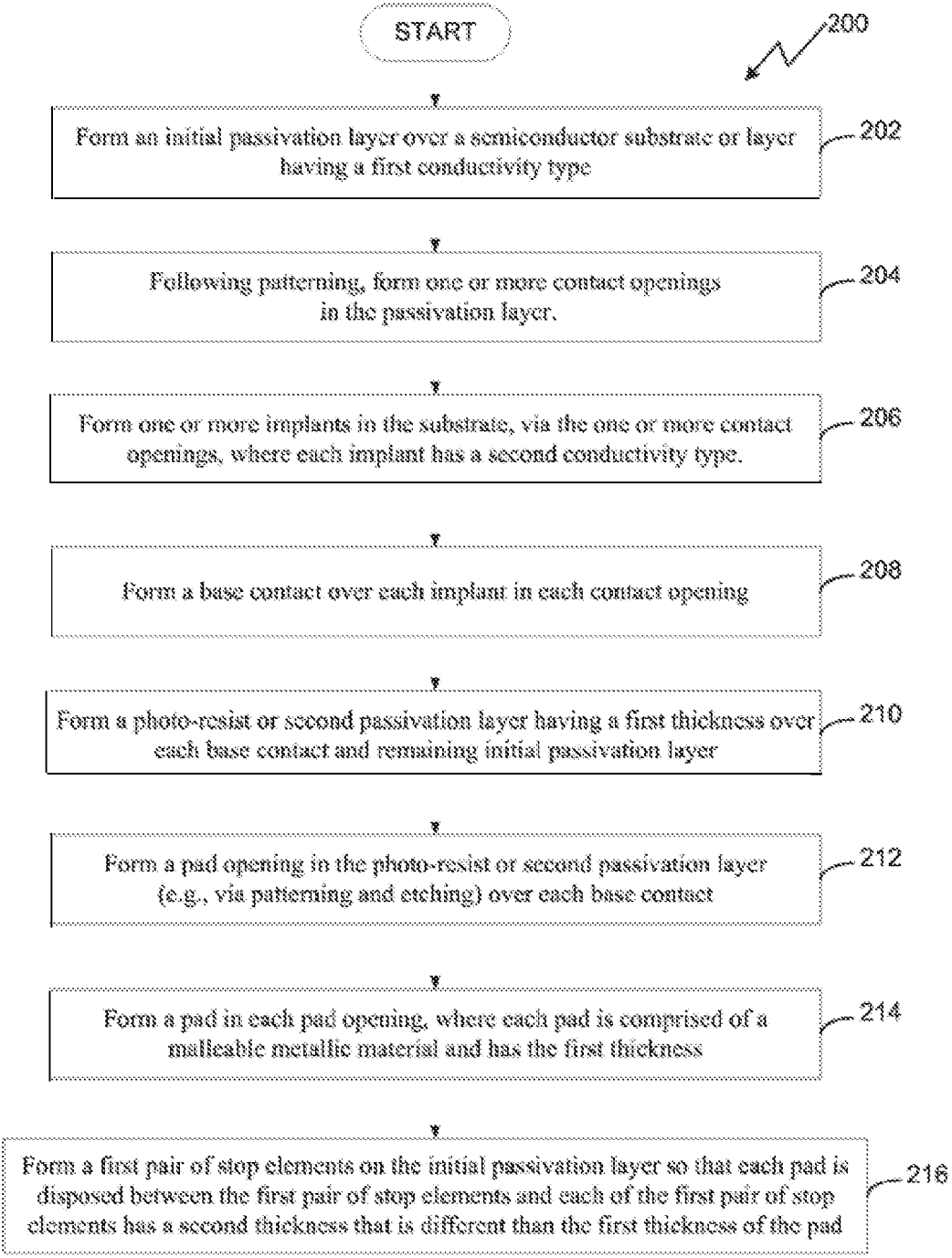

Methods consistent with the present invention provide a process 200 depicted in FIGS. 2A-2B for manufacturing a focal plane array (FPA) of an imaging device, where an array of photodetectors with dimensions comparable to the cutoff wavelength of the respective photodetector is aligned with and interconnected to a unit cell of a readout integrated circuit (ROIC or readout circuit) to enable the realization of very small pixel pitches. FIGS. 3A to 3F and 3H to 3J are cross sectional views of an exemplary photodetector array 302 and an exemplary ROIC 304 of an imaging device 300 (as completed in FIG. 3J), where the photodetector array 302 and the ROIC 304 are illustrated at various steps of the manufacturing process 200. FIG. 3G is a top level view of the exemplary photodetector array 302 corresponding to the cross-sectional view in FIG. 3F and before the ROIC 304 having one or more contact plugs 350a-350c is applied in accordance with the present invention to the photodetector array 302 as depicted in FIGS. 3H-3J. Each contact plug 350a-350c is associated with and reflects a respective unit cell of the ROIC 304.

Figure 3A:
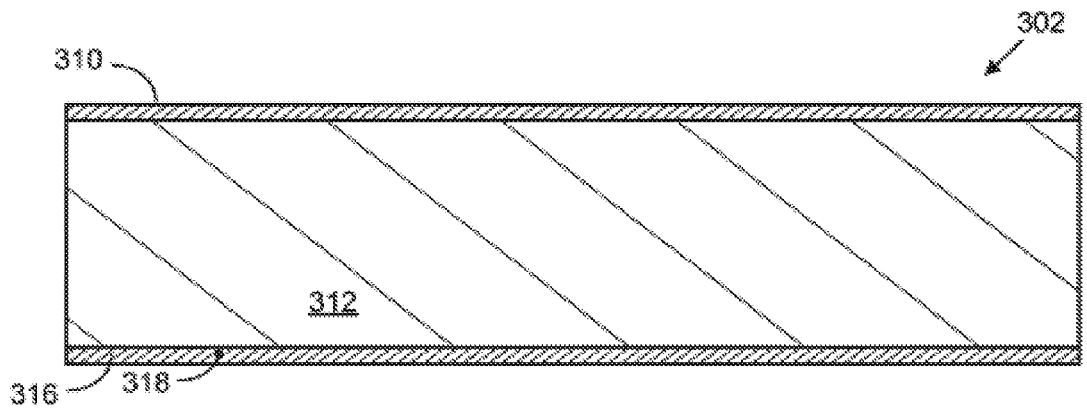
FIGS. 3A to 3F and 3H to 3J are cross sectional views of an exemplary photodetector array and an exemplary ROIC of an imaging device manufactured in accordance with the process depicted in FIG. 2, where the photodetector array and the ROIC are illustrated at various steps of the manufacturing process.
Figure 3B:
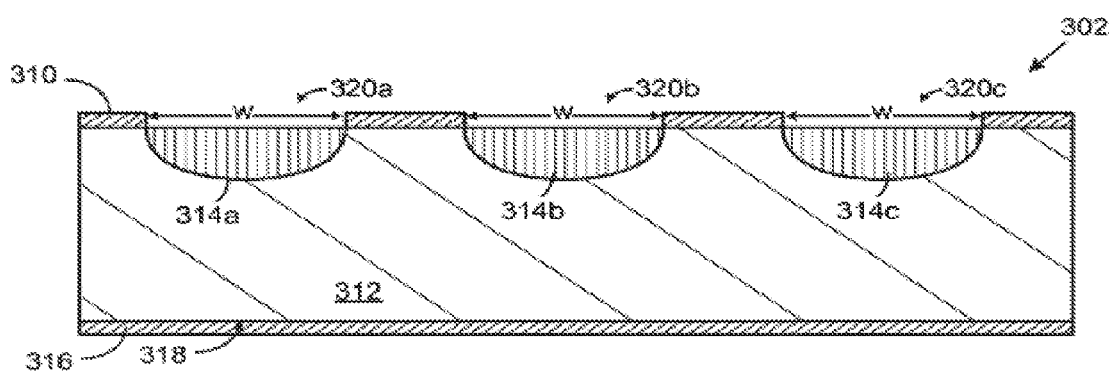
Figure 3C:
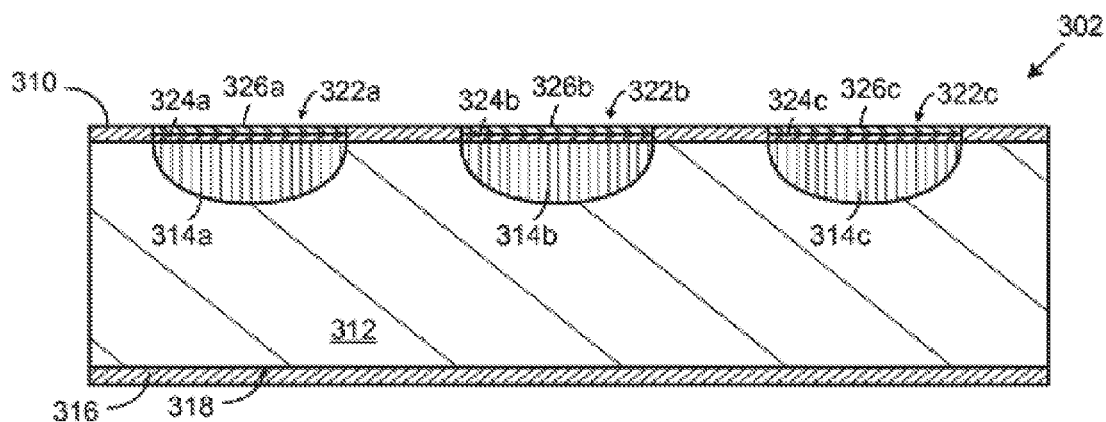

As shown in FIG. 2A and FIG. 3A, a passivation layer 310 is initially formed over a semiconductor substrate or layer 312 having a first conductivity type (step 202). In a pre-processing step, the semiconductor layer 312 may initially be formed over or deposited on a substrate (not shown in figures) comprising cadmium zinc telluride (e.g., when the semiconductor layer 312 comprises mercury-cadmium telluride), indium phosphide (e.g., when the semiconductor layer 312 comprises indium gallium arsenide), or other material suitable for forming a semiconductor layer. The substrate upon which the semiconductor layer 312 is formed may be removed using any known semiconductor device manufacturing technique, which is not described to avoid obscuring the present invention.

The passivation layer 310 may comprise cadmium telluride (CdTe), cadmium zinc telluride, cadmium telluride selenium, zinc sulfide, or any other suitable passivation material. The passivation layer 310 has a thickness in a range of 30 nm to 250 nm.

In one implementation, the semiconductor substrate or layer 312 comprises an infrared sensitive material, such as mercury cadmium telluride (HgCdTe), mercury zinc telluride (HgZnTe), mercury cadmium zinc telluride (HgCdZnTe), cadmium telluride (CdTe), cadmium zinc telluride (CdZnTe), indium gallium arsenide (InGaAs), or indium antimonide (InSb), doped with a material, such as Arsenic (As) or Copper (Cu), to form a p-type semiconductor layer. Alternatively, the semiconductor layer 312 may comprise silicon, germanium, gallium arsenide (GaAs), indium antimonide (InSb), other III V or II VI compound semiconductors, or the like, suitable for forming a photodetector. In an alternative implementation, the semiconductor substrate or layer 312 may be doped with another material so that the semiconductor layer 312 has a second conductivity type (e.g., n-type) different from the first conductivity type (e.g., p-type). For example, the semiconductor substrate or layer 312 may be doped with Boron (B) or other n-type material layer. Accordingly, each photodetector (as reflected by implanted regions 314a-314c in FIG. 3B) fabricated in the photodetector array 302 in accordance with the present invention may have a p-on-n or a n-on-p architecture and corresponding junction without departing from the scope of the present invention.

In addition, as shown in FIGS. 3A-3F and 3H-3J, the starting detector material may have another passivation layer 316 formed on a back-side 318 of the semiconductor layer 312 to form a double sided passivated semiconductor layer 302, allowing for front-side illumination of the photodetector array 302. In an alternative implementation, the manufacturing steps discussed here may be applied so that the photodetectors of the array 302 are formed on the back-side 318 of the semiconductor layer 302 with the passivation layer 310 remaining intact over the front-side of the semiconductor layer 302, allowing for back-side illumination of the photodetector array 302.

Continuing with FIG. 2A, the passivation layer 310 is patterned using photolithography and etched using a dry or a wet etching technique, to form openings such as 320a, 320b and 320c in the passivation layer 310 (step 204) that expose the substrate 312. One of ordinary skill in the art would appreciate that other patterning and etching techniques may be employed without departing from the present invention. The openings 320a, 320b and 320c may each have a width (w) within the range of 0.3 μm to 1 μm (and preferably less than 0.8 μm), allowing each photodetector (as represented by the implanted regions 314a-314c) to be formed to a pixel pitch that is approximately equal to a cutoff wavelength of the radiation to be detected by the respective photodetector.

Next, one or more implanted regions 314a, 314b and 314c are formed in the substrate, via the one or more openings, where each implanted region has a second conductivity type that is different than the first conductivity type of the substrate 312 (step 206). For example, when the semiconductor layer 312 is comprised of HgCdTe doped with Arsenic (As) to have a p-type conductivity, Boron (B+) may be implanted, via each opening 320a, 320b and 320c, into the substrate 312 to form implanted regions 314a, 314b or 314c having an n-type conductivity. Each implanted region 314a, 314b or 314c having the second conductivity type forms a junction with the substrate 312 having the first conductivity type to effectively form a n-on-p architecture associated with a respective photodetector. Alternatively, each photodetector may be implemented to have a p-on-n junction architecture when the semiconductor layer 312 is doped with Indium, for example, to have n-type conductivity. Note, in an alternative implementation, following the patterning, the implants may be formed through the passivation layer before the formation of the contact openings 320a, 320b and 320c via etching.

Each implanted region 314a, 314b and 314c has the approximate width (w) of the opening 320a, 320b or 320c through which the respective implanted region was formed. Thus, the photodetector represented by the respective implanted region 314a, 314b or 314c is formed to a pixel pitch that is approximately equal to a cutoff wavelength of the radiation to be detected by the respective photodetector. For example, the pixel pitch (e.g., $d_1$, as shown in FIG. 3H) of the photodetector represented by implanted region 314a may be approximately 2.5 microns or less, corresponding to the cut-off wavelength of the SWIR spectral band.

After forming the implanted regions 314a, 314b and 314c, a base contact 322a, 322b or 322c is formed over each implanted region 314a, 314b and 314c in each contact opening 320a, 320b and 320c (step 208). Each base contact 322a, 322b or 322c is comprised of a metal or metal alloy and is formed to a thickness substantially equal to the thickness of the initial passivation layer 310. In one implementation, each base contact 322a, 322b and 322c has two layers 324a and 326a, 324b and 326b or 324c and 324c. The first layer 324a, 324b or 324c is comprised of a first type of material that substantially bonds or adheres to the material comprising the implanted region 314a, 314b or 314c (e.g., Boron doped HgCdTe). The second layer 326a, 326b or 326c is comprised of a second type of material that substantially bonds or adheres to the first layer material and to the malleable metallic material comprising each pad (e.g., each pad 332a, 332b or 332c in FIG. 3F comprises Indium). In one implementation, the first layer 324a, 324b or 324c of each base contact comprises Nickel (Ni) deposited over a respective implanted region 314a, 314b or 314c to have a thickness of approximately 100 Angstroms or within a range of 50 Angstroms to 150 Angstroms. In this implementation, the second layer 326a, 326b or 326c of each base contact comprises Titanium (Ti) deposited over a respective first layer 324a, 324b or 324c to have a thickness of approximately 100 Angstroms or within a range of 50 Angstroms to 1000 Angstroms. The thickness of the Titanium is equal to or greater than the thickness of the Nickel in the base contact. In one implementation, the thickness of the Nickel is sufficient to enable the Titanium portion of the base contact to adhere to a respective pad 332a, 332b or 332c comprised of Indium. In this implementation, the second layer 326a, 326b or 326c of Titanium adheres better than Nickel to the Indium used to form the contact pad.

Figure 3D:
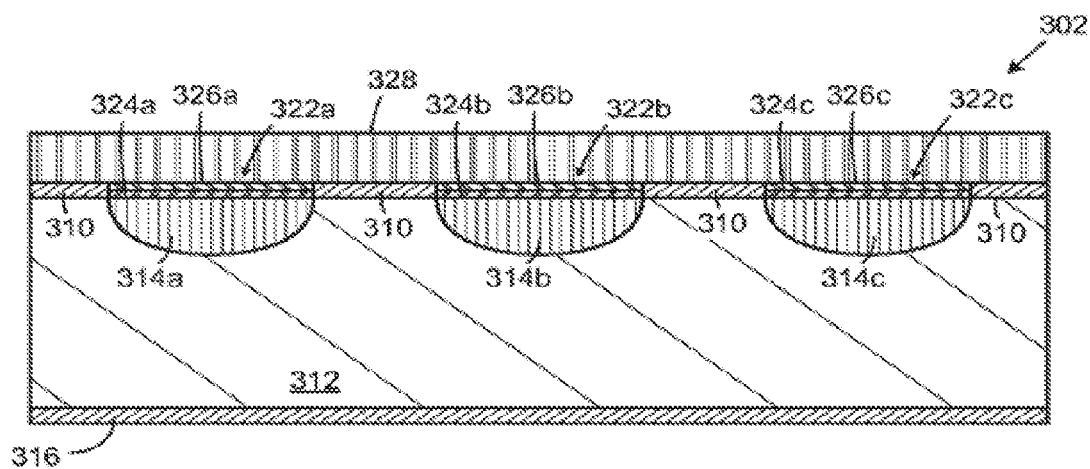
Figure 3E:
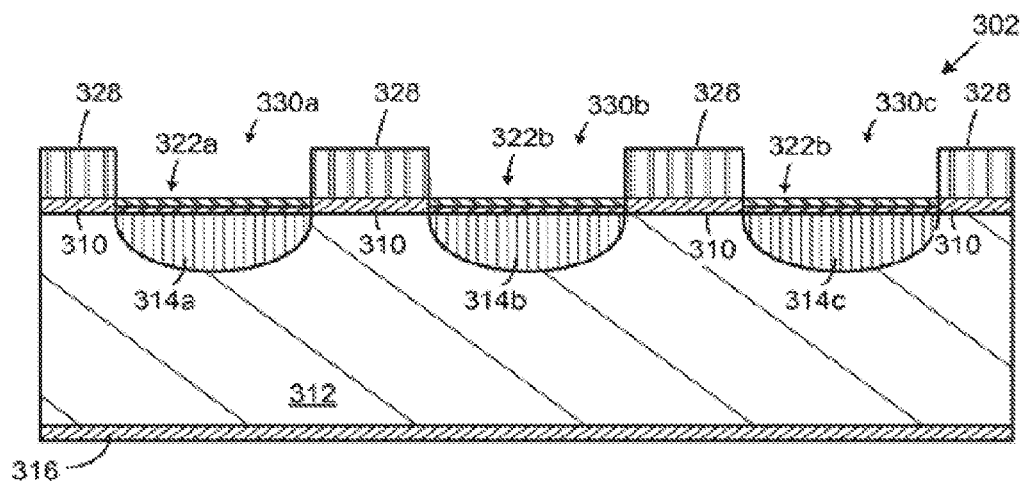

As shown in FIG. 2A and FIG. 3D, a self-limiting photo-resist layer 328 is then deposited or formed over each base contact 322a, 322b or 322c and remaining initial passivation layer 310 to have a first thickness within a range of 0.5 μm to 1 μm (step 210). As shown in FIG. 3E, a pad opening 330a, 330b or 330c is formed (e.g., via patterning and etching) in the photo-resist layer 328 over each base contact 322a, 322b and 322c (step 212). Each opening 330a, 330b and 330c may extend from the top of the photo-resist layer 328 to the base contact 322a, 322b and 322c, which may be exposed via the etching process.

Figure 3F:
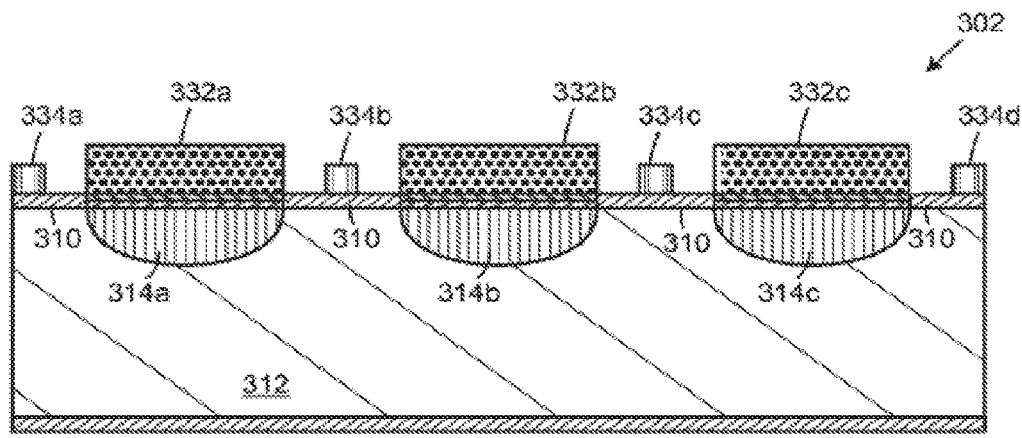
Figure 3G:
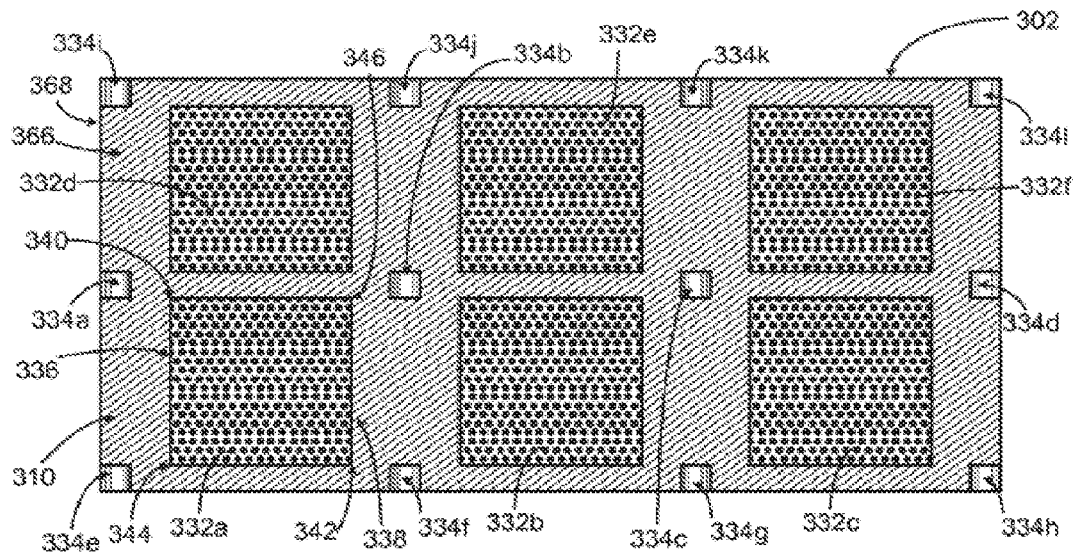
FIG. 3G is a top level view of the exemplary photodetector array corresponding to the cross-sectional view in FIG. 3F and before the ROIC having one or more contact plugs is applied in accordance with the present invention to the photodetector array as depicted in FIGS. 3H-3J.
Figure 3H:
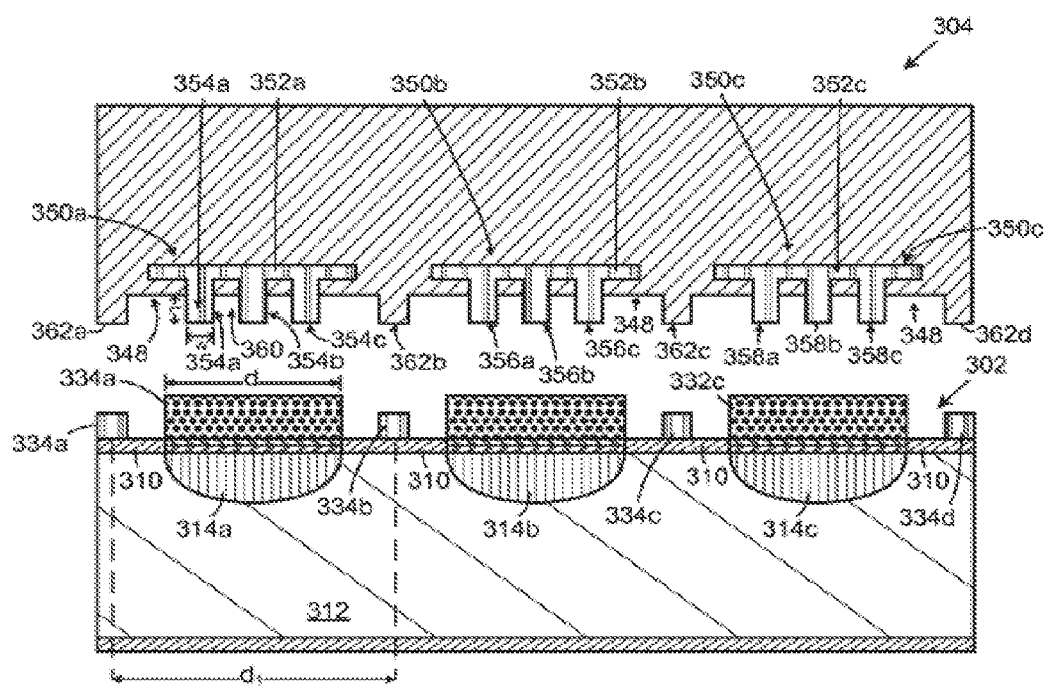
Figure 3I:
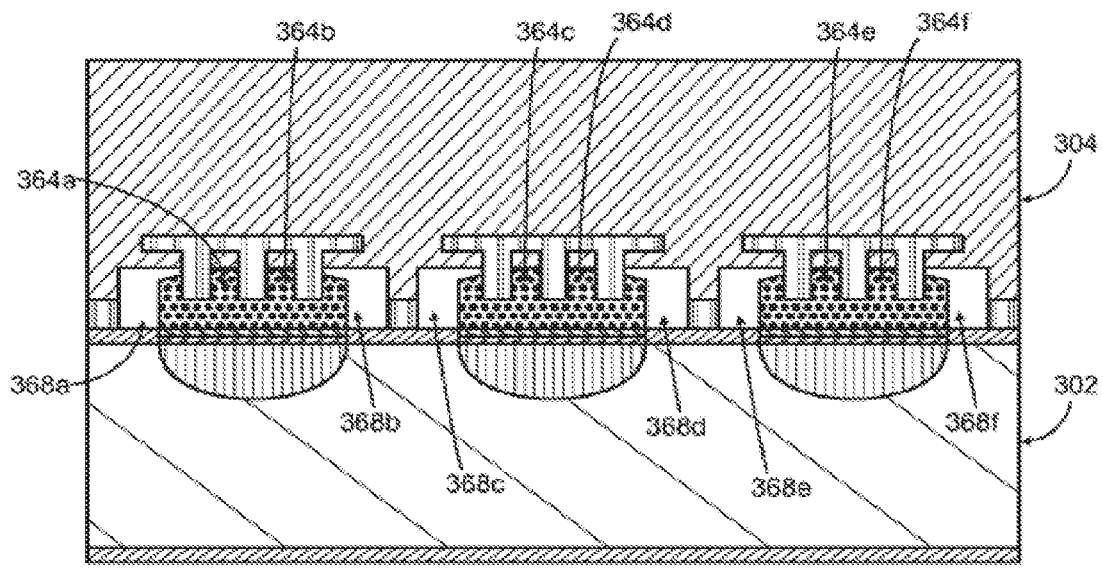
Figure 3J:
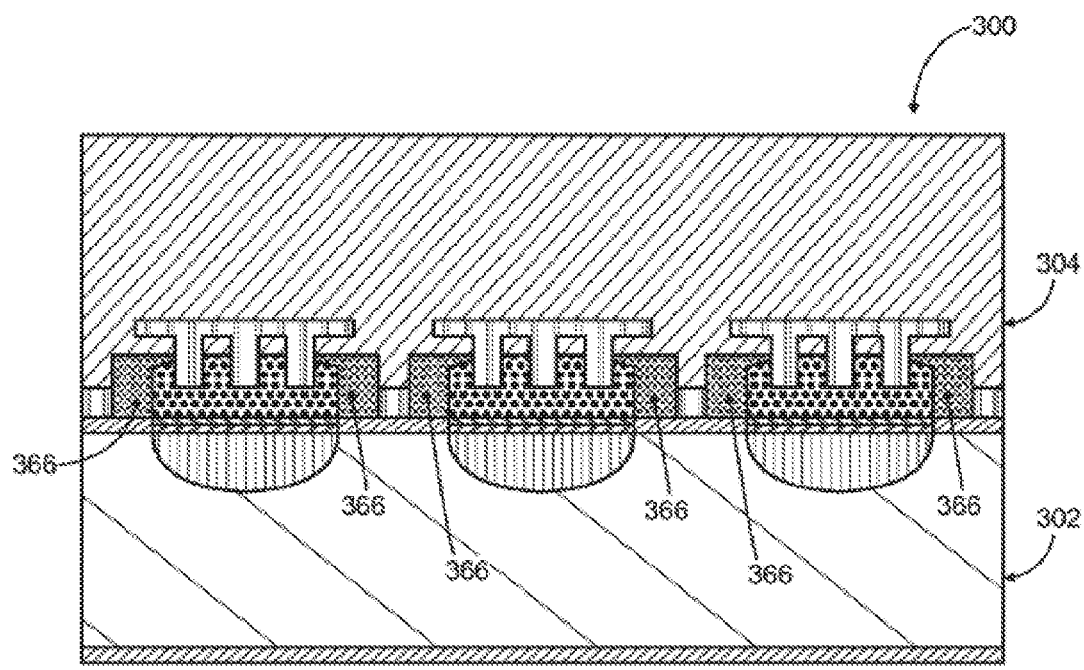

Next, a pad 332a, 332b or 332c comprised of a malleable metallic material or alloy, such as Indium or suitable Indium alloy, is formed in each pad opening 330a, 330b and 330c (step 214) as shown in FIG. 3F. In one implementation, each pad 332a, 332b and 332c is formed to have the first thickness of the photo-resist layer 328.

As depicted in FIG. 3F, the photo-resist layer 328 is then patterned and etched to form at least a first pair of stop elements (e.g., 334a and 334d) on the initial passivation layer 310 so that each pad 332a, 332b and 332c is disposed between the first pair of stop elements (e.g., 334a and 334d) and each of the first pair of stop elements has a second thickness that is different than the first thickness of the pad (step 216). As discussed in further detail below, at least the first pair of stop elements (e.g., 334a and 334d) on the photodetector array 302 are adapted to contact at least a second pair of stop elements (e.g., 362a and 362d in FIG. 3H) on the readout circuit 304 so as to inhibit further movement of the readout circuit 304 towards the photodetector array 302, preventing damage to the base contacts 322a, 322b and 322c and underlying photodetector implanted regions 314a, 314b and 314c. In the implementation shown in FIGS. 3F and 3G, the first pair of stop elements may be two of a plurality of stop elements 334a-334l formed from the photo-resist layer 328 on the initial passivation layer 310 of the photodetector array 302 in accordance with the present invention. In one implementation, each pad 332a, 332b, 332c, 332d, 332e and 332f may be disposed between a respective pair of stop elements. For example, as shown in FIG. 3G, a pad 332a may be disposed between a pair of stop elements 334a and 334b located near opposing sides 336 and 338 of the pad 332a or between a pair of stop elements 334a and 334f located near opposing corners 334a and 334f so as to contact a corresponding pair of stop elements on the readout circuit 304 so as to inhibit further movement of the readout circuit 304 towards the respective pad 332a of the photodetector array 302, preventing damage to the base contact 322a and photodetector implanted region 314a underlying the pad 332a. To provide further reliability in connecting the ROIC 304 to the photodetector array 302 as further described herein, each pad 332a-332f may be disposed between a respective four stop elements located about the pad 332-333f. For example, as shown in FIG. 3G, each pad (e.g., pad 332a) may be disposed between a respective four stop elements (e.g., 334a, 334b, 334e and 334f) located near corners (e.g., 340, 342, 344 and 346) of the respective pad.

In addition, although the pads 332a-332f are shown in FIG. 3G as having a square shape, each pad 332a-332f may have a polygon, circular or other shape without departing from the spirit of the present invention. Furthermore, although the stop elements 334a-334l are depicted as square posts, the stop elements 334a-334l may also have a polygon, circular or other shape and be formed in a strip or line without departing from the spirit of the present invention. Moreover, in an alternative implementation, each pad 332a-332f may be surrounded on at least three sides by a single stop element (e.g., 334a) formed in a strip or line.

Turning to FIG. 2B, a readout circuit 304 is formed or provided that has a first side 348 and a contact plug 350a, 350b or 350c for each pad 332a, 332b and 332c (step 218). Each contact plug 350a, 350b or 350c has a base 352a, 352b and 352c affixed to the first side 348 of the readout circuit 304 and one or a plurality of prongs 354a-354c, 356a-356c or 358a-358c, extending from the base 352a, 352b or 352c away from the first side 348 of the ROIC 304. Each contact plug 350a, 350b or 350c may comprise a material (such as Tungsten) that may be pressed into and substantially bond or adhere to the malleable metallic material or metal alloy (e.g., Indium or alloy thereof) comprising a respective pad 332a-332f, either with or without an annealing processing step. Each prong of a respective contact plug 350a, 350b or 350c may have a polygon, circular or other shape. Each prong 354a-354c, 356a-356c or 358a-358c may extend a length (L) from the top side 348 of the ROIC 304 that is within a range of 0.25 microns to 0.5 microns. In addition, each prong 354a-354c, 356a-356c or 358a-358c may have a diameter or width (w) is within a range of 0.25 microns to 0.5 microns. Each set of adjacent prongs (e.g., 354a and 354b) define a space 360 therebetween. In one implementation, the combined width of the prongs and spaces 360 between adjacent prongs for a contact plug (e.g., 350a) does not exceed the width (d) of the pad (e.g., 332a) to which the contact plug is to be connected as described below or the pixel pitch ($d_1$) of the photodetector associated with the pad (e.g., 332a).

As shown in FIG. 2B, a second pair of stop elements (e.g., stop elements 362a and 362d in FIG. 3H) are provided or formed on the first side 348 of the readout circuit 304 so that the base 352a, 352b or 352c of each contact plug 350a, 350b and 350c is disposed between the second pair of stop elements (e.g., stop elements 262a and 262d) and in substantial axial alignment with the first pair of stop elements (e.g., 334a and 334d) of the photodetector array 302 (step 220). Each of the stop elements of each contact plug 350a, 350b and 350c has a third thickness such that the combined thickness of a stop element (e.g., 362a) of a contact plug (e.g., 350a) and a corresponding stop element (e.g., 334a) of the photodetector array 302 is more than the length (L) of each prong (e.g., 354a-354c) of the respective contact plug (e.g., 350a) such that the prongs (e.g., 354a-354c) are inhibited from passing completely through the associated pad (e.g., 332a).

In the implementation shown in FIG. 3H, the second pair of stop elements of the readout circuit 304 may be two of a plurality of stop elements 362a-362d provided or formed on the first side 348 of the readout circuit 304. In one implementation, each contact plug 350a, 350b and 350c may be disposed between a respective pair of stop elements 362a-362d. For example, as shown in FIG. 3H, a contact plug 350a may be disposed between a pair of stop elements 362a and 362b located near opposing sides (as reflected by prongs 354a and 354c) of the contact plug 350a, or between a pair of stop elements located near opposing ends or corners (not shown in figures) of the contact plug 350a. In the implementation of the photodetector array 302 shown in FIG. 3G, the readout circuit 304 may have a stop element 362a-362l (elements 362e-362l not shown in the figures) for each stop element 334a-334l of the photodetector array 302. In this implementation, each of the stop elements 362a-362l of the readout circuit 304 are substantially aligned with and adapted to contact a corresponding stop element (e.g., element 334a-334l) of the photodetector array 302 so as to inhibit further movement of the readout circuit 304 towards the pads 332a-332f of the photodetector array 302, preventing damage to the base contact and photodetector implanted region underlying each pad 332a-332f.

Continuing with FIG. 2B, the first side 348 of the readout circuit 304 is moved towards the semiconductor substrate or layer 312 of the photodetector array 302 in substantial axial alignment with the stop elements 334a-334d of the photodetector array and the stop elements 362a-362d of the readout circuit 304 such that the prongs 354a-354c, 356a-356c or 358a-358c of each contact plug 350a, 350b and 350c are pressed into each pad 332a, 332b and 332c and displace a portion (e.g., 364a, 364b, 364c, 364d, 364e or 364f) of the respective pad into the space 360 between adjacent prongs (step 222).

The first side 348 of the readout circuit 304 continues to be moved towards the photodetector array 302 in substantial axial alignment with the stop elements 334a-334d of the photodetector array and the stop elements 362a-362d of the readout circuit 304 until each stop element of the photodetector array 302 (or the first pair of stop elements 334a and 334d) contacts a corresponding stop element of the readout circuit 304 (or the second pair of stop elements 362a and 362d) as shown in FIG. 3I. As previously noted, the combined thickness of each stop element of the photodetector array 302 (e.g., each of the first pair of stop elements 344a and 334d) and the corresponding stop element of the readout circuit 304 (e.g., corresponding one of the second pair of stop elements 362a and 362d) is more than the length (L) of each prong 354a-354c, 356a-356c and 358a-358c such that the prongs are inhibited from passing completely through the respective pad 332a, 332b or 332c (step 224).

In an alternative implementation, step 220 is skipped and stop elements 362a, 362b, 362c and 362d are not formed that the first side 348 of the readout circuit 304. In this implementation, in step 222, the first side 348 of the readout circuit 304 is moved towards the semiconductor substrate or layer 312 of the photodetector array 302 such that the prongs 354a-354c, 356a-356c or 358a-358c of each contact plug 350a, 350b and 350c are pressed into a respective one of the pads 332a, 332b and 332c and displace a portion (e.g., 364a, 364b, 364c, 364d, 364e or 364f) of the respective pad into the space 360 between adjacent prongs. In addition, in this implementation in step 224, the first side 348 of the readout circuit 304 continues to be moved towards the photodetector array 302 until each stop element of the photodetector array 302 (or the first pair of stop elements 334a and 334d) contacts the first side 348 of the readout circuit 304. In this implementation, the thickness of each stop element of the photodetector array 302 (e.g., each of the first pair of stop elements 344a and 334d) is more than the length (L) of each prong 354a-354c, 356a-356c and 358a-358c such that the prongs are inhibited from passing completely through the respective pad 332a, 332b or 332c.

In one implementation, to facilitate the hybridization of each contact plug 350a-350c of the readout circuit 304 to a corresponding pad 344a-344c of the photodetector array 302, the photodetector array 302 may be warmed to a predetermined temperature that is below the melting point of the material used to form each pad 332a-332c. For example, when each pad 332a-332c is comprised of Indium, the photodetector array 302 may be warmed to a predetermined temperature that is equal to or less than 80° C.

Before or while the photodetector array 302 is being warmed, epoxy 366 (shown in FIG. 3J) may be injected or wicked into a cavity 368a-368f (shown in FIG. 3I), a portion of which is defined by two or more of the following: a pad 332a, 332b or 332c; a stop element 334a-334n of the photodetector array 302 (e.g., a first 334a of the first pair of stop elements 334a and 334d); a corresponding stop element 362a-362n of the readout circuit 304 (e.g., a first 362a of the second pair of stop elements 362a and 362d) in contact with the stop element (e.g., 334a) of the photodetector array 302; the initial passivation layer 310 and the first side 348 of the readout circuit 304 (step 226). Note the predetermined temperature may be above the melting point of the material used to form the photo-resist layer 328 from which the stop elements 344a-344d of the photodetector array 302 are formed. In this implementation, the stop elements 344a-334d and/or the epoxy 366 flows to surround and encapsulate the perimeter of each pad 332a, 332b or 332c, preventing excess malleable metallic material (e.g., Indium) of one pad (e.g., pad 332a) from shorting to an adjacent pad (e.g., 332b or 332d in FIG. 3G). Once the photodetector array 302 is cooled back to room temperature, the wicking process is ended as the epoxy 366 and/or stop elements 344a-334d made from photo-resist material solidify. The combination of the photodetector array 302 and the respective unit cells of the ROIC 304 form the FPA of the imaging device 300, and may be mounted on a chip carrier.

Figure 4:
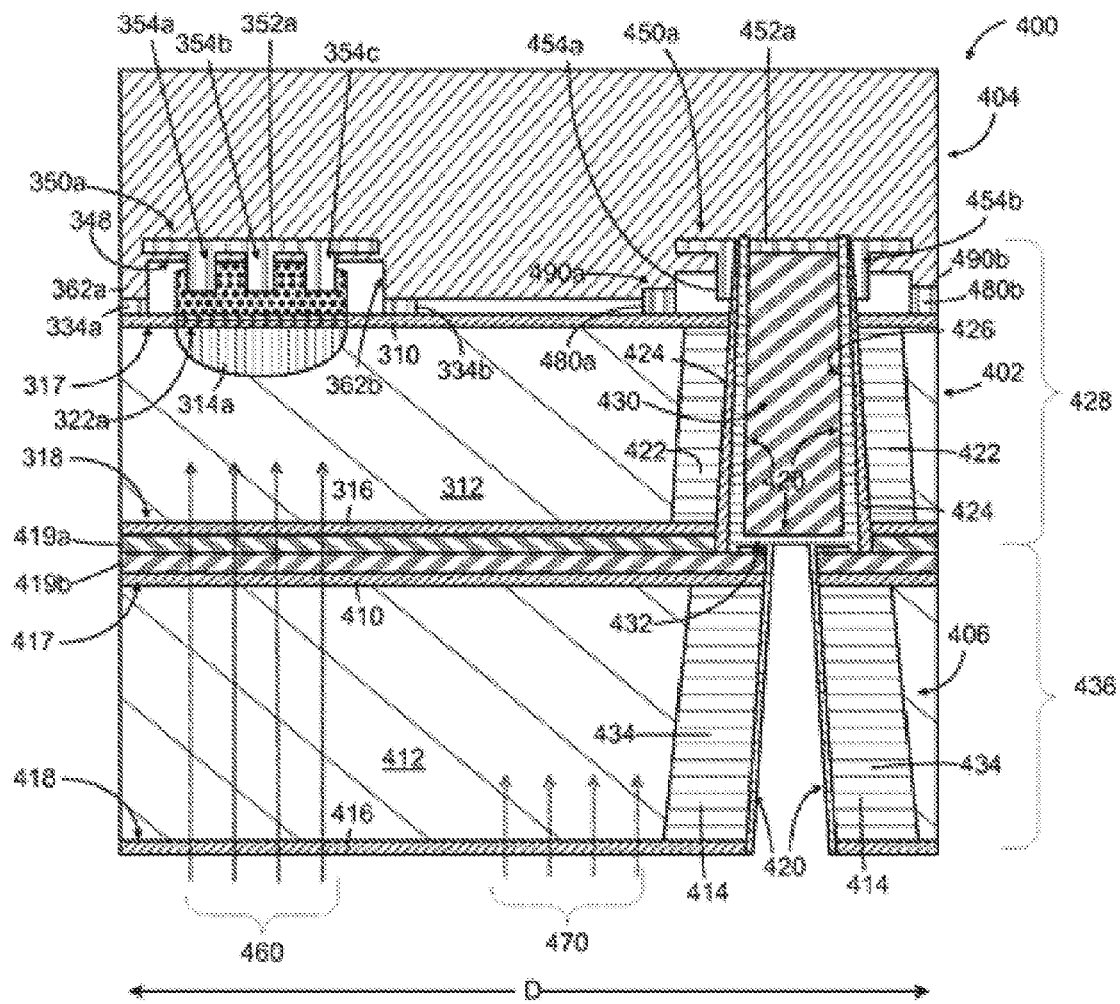
FIG. 4 is a cross sectional view of another imaging device manufactured in accordance with the present invention, in which the imaging device has an exemplary ROIC, a first exemplary photodetector array manufactured in accordance with the process depicted in FIG. 2, and a second exemplary photodetector array that collectively form a two color focal plane array for the imaging device.

Turning to FIG. 4, another imaging device 400 manufactured consistent with the present invention is shown. The imaging device 400 incorporates the ROIC 304 (i.e., ROIC 404 in FIG. 4) and the photodetector array 302 (i.e., photodetector array 402 in FIG. 4) of the imaging device 300. The photodetector array 402 and ROIC 404 are each manufactured and connected to each other in accordance with the process depicted in FIG. 2 as previously discussed, except as noted below. As shown in FIG. 4, the imaging device 400 also includes a second photodetector array 406 formed below the first photodetector 402. As further described herein, the ROIC 404, the first photodetector array 402 and the second photodetector array 406 collectively form a two color focal plane array of the imaging device 400, in which each unit cell (as shown in FIG. 4) of the focal plane array has a smaller pitch (e.g., D equal to or less than 15 μm) than other conventional two color imaging devices.

Consistent with the photodetector array 302 and the manufacturing process depicted in FIG. 2, the photodetector array 402 of the imaging device 400 includes a first semiconductor layer 312 having a first surface 317 (which may be a front-side surface) and a second surface 318 (which may be a back-side surface) upon which a respective passivation layer 310 or 316 is formed. The first semiconductor layer 312 has a first conductivity type (e.g., p-type) and include an infrared sensitive material, such as HgCdTe, HgZnTe, HgCdZnTe, CdTe, CdZnTe, InGaAs or InSb. A first implanted region 314a is formed in the first semiconductor layer 312 to form a p-on-n or a n-on-p architecture for a first photodetector of the first photodetector array 402.

A base contact 322a is formed over the implanted region 314a. The base contact 322a is comprised of a metal or metal alloy and is formed to a thickness substantially equal to the thickness of the initial passivation layer 310. As previously described, the base contact 322a may have two layers 324a and 326a. In this implementation, the first layer 324a is comprised of a first type of material (e.g., Nickel) that substantially bonds or adheres to the material comprising the implanted region 314a (e.g., Boron doped HgCdTe). The second layer 326a is comprised of a second type of material (e.g., Titanium) that substantially bonds or adheres to the first layer material and to the malleable metallic material comprising the pad 332a, which is formed on the base contact 332a for the first photodetector (as reflected by the implant 314a) of the photodetector array 402. In one implementation, the malleable metallic material comprising the pad 332a is Indium or a suitable Indium alloy.

The ROIC 404 is disposed over the first surface 317 of the first semiconductor layer 312 and the passivation layer 310 formed thereon. The ROIC 404 has a plurality of contact plugs (e.g., 350a and 450a in FIG. 4) facing the first surface 317 of the first semiconductor layer 312. A first 350a of the contact plugs 350a and 450a has a first base 352a and one or more prongs 354a-354c extending from the first base 350a and into the malleable metallic material of the pad 332a of the first photodetector. A second 450a of the contact plugs is disposed adjacent to the first contact plug 350a. The second contact plug 450a includes a second base 452a and may include one or more prongs 454a and 454b extending from the second base 452a.

The second photodetector array 406 includes a second semiconductor layer 412 disposed below the second surface 318 of the first semiconductor layer 312. A respective passivation layer 410 and 416 may be formed on a front-side surface 417 and back-side surface 418 of the second semiconductor layer 412 in the same manner as described for the first semiconductor layer 312.

A second implanted region 414 is formed in the second semiconductor layer 412 adjacent to and below (but not directly beneath) the first implant region 314a of the first semiconductor layer 312. The second semiconductor layer 412 has a conductivity type (e.g., p-type) that is different from the conductivity type (e.g., n-type) of the second implanted region 414 to form the p-on-n or n-on-p architecture for the second photodetector in the second semiconductor layer 412.

In one implementation as shown in FIG. 4, two or more layers 419a-419b of filler material and/or epoxy may be disposed between and used to attach the lower passivation layer 316 formed on the second surface 318 of the first semiconductor layer 312 and the upper passivation layer 410 formed on the front-side 417 or upper surface of the second semiconductor layer 412.

As shown in FIG. 4, the imaging device 400 includes a metalized via 420 extending through the first photodetector array 402 (and the first semiconductor layer 312 thereof) and through the second photodetector array 406 (and the second semiconductor layer 412 thereof) so that the metalized via 420 electrically connects the second implanted region 414 formed in the second semiconductor layer 412 to the second base 452a or prong 454a or 454b of the second contact plug 450a of the ROIC 404. Thus, each unit cell of the ROIC 404 has two contact plugs 350a and 450b, each of which is connected to a respective photodetector (as reflected by implants 314a and 414) formed in one of the two semiconductor layers 312 and 412, enabling the imaging device 400 to detect two different wavelengths or colors in a predetermined band.

The metalized via 420 may be formed using known via boring techniques. In one implementation, the second implant region 414 in the second semiconductor layer 412 (as well as a third implant region 422 in the first semiconductor layer 312) is formed during the via boring process. In one process for forming the metalized via 420, the first photodetector array 402 and the ROIC 404 are first formed and connected together in accordance with the manufacturing process depicted in FIG. 2. A first bore hole (having side walls 426 defined by the third implant region 422 in FIG. 4) is then formed through the first semiconductor layer 312 (and the passivation layers 310 and 316 sandwiching the first semiconductor layer 312) in perpendicular alignment with the second contact plug 450*a* of the ROIC 404. An insulation film 424 is then deposited on the side walls 426 of the first bore hole using known deposition techniques to prevent contact between the metalized via 420 and the first semiconductor layer 312 or the third implant region 422 therein. In one implementation, the insulation film 424 may be deposited so that the insulation film 424 extends through the first semiconductor layer 312 to the base 452*a* of the second contact plug 450*a*. If necessary, the first bore hole may be re-bored at a smaller diameter in order to remove excess insulation or insulation blocking access to the base 452*a* of the second contact plug 450*a*. A first portion 428 of the metalized via 420 may then be deposited over the insulation film 424 in the first bore hole so that the metalized via 420 is electrically connected to the second contact plug 450*a* but not the first semiconductor layer 312 or the third implant region 422 that may be formed therein during the boring process. A filler material 430, such as epoxy, may be deposited over the first portion 428 of the metalized via 420 to fill any excess area in the first bore hole. A second portion 432 of the metalized via 420 may be deposited as a layer on top of the filler material 430 to provide a base contact extension in proximity to the second or back-side surface 318 of the first semiconductor layer 312.

Next, a second bore hole (having side walls 434 defined by the second implant region 414) is formed through the second semiconductor layer 412 (and the passivation layers 410 and 416 sandwiching the second semiconductor layer 412) in perpendicular alignment with base contact extension (e.g., the second portion 432 of the metalized via 420) and the second contact plug 450*a* of the ROIC 404. A third portion 436 of the metalized via 420 may then be deposited on the side walls 434 of the second bore hole so that the metalized via 420 electrically connects the second implant region 414 to the base contact extension 432 and, thus, to the second contact plug 450*a*. Thus, the ROIC 404 is structured to read the first photodetector defined by the first implant region 314*a* in the first semiconductor layer 312 and to read the second photodetector defined by the second implant region 414 in the second semiconductor layer 412, where the second implant region 414 is disposed adjacent to and below (but not directly beneath) the first implant region 314*a* of the first photodetector in the first semiconductor layer 312. In this implementation, the first photodetector as defined by the first implant region 314*a* is effective to detect a first wavelength associated with a first portion of a predetermined band (e.g., the visible band or infrared band) that passes through the second semiconductor layer and into the first semiconductor layer 312. The second photodetector defined by the second implant region in the second semiconductor layer is effective to detect a second wavelength associated with a second portion of the predetermined band. Wavelengths 460 associated with the first portion of the predetermined band and detected by the first photodetector in the first semiconductor layer 312 are longer than wavelengths 470 associated with the second portion of the predetermined band and detected by the second photodetector in the second semiconductor layer 412.

In accordance with the present invention, the imaging device 400 further comprises a first pair of stop elements (e.g., 334*a* and 334*b*) each of which is disposed over the first surface 317 of the first semiconductor layer 312 such that the pad 332*a* of the first photodetector is disposed between the first pair of stop elements 334*a* and 334*b*. The ROIC 404 has a second pair of stop elements (e.g., 362*a* and 362*b*) disposed on the first side 348 of the ROIC 404. The base 352*a* of the first contact plug 350*a* is affixed to the first side 348 of the ROIC 404 such that the prong 354*a* of the first contact plug 350*a* extends away from the first side 348 of the ROIC 404 and between the second pair of stop elements 362*a* and 362*b*. When the ROIC 404 is moved towards the first surface 317 of the first semiconductor layer 312, the first pair of stop elements 334*a* and 334*b* formed over the semiconductor layer 312 (and formed on the passivation layer 310 in one implementation) contact the second pair of stop elements 362*a* and 362*b* of the ROIC 404 such that each prong 354*a*-354*c* of the first contact plug 322*a* is inhibited from passing completely through the pad 332*a* of the first photodetector.

As shown in FIG. 4, the imaging device 400 further comprises a third pair of stop elements 480*a* and 480*b* each of which is disposed over the first surface 317 of the first semiconductor layer 312 such that the metalized via 420 is disposed between the third pair of stop elements 480*a* and 480*b*. The ROIC 404 has a fourth pair of stop elements 490*a* and 490*b* disposed on the first side 484 of the ROIC 404. The third pair of stop elements 480*a* and 480*b* is disposed relative to and contacting the fourth pair of stop elements 490*a* and 490*b* such that each prong 454*a* and 454*b* of the second contact plug 450*a* is inhibited from contacting the first surface 318 of the first semiconductor layer 312.

As previously discussed, when the first side 348 of the ROIC 404 is moved towards the first semiconductor layer 312 of the first photodetector array 402 in substantial axial alignment with the stop elements 334*a*-334*b* and 480*a*-480*b* of the first photodetector array and the stop elements 362*a*-362*b* and 490*a*-490*b* of the ROIC 404, the prongs 354*a*-354*c* of the first contact plug 350*a* is pressed into the pad 332*a* and displaces a portion of the pad 332*a* into the space between adjacent prongs (e.g., 354*a* and 354*b* or 354*b* and 354*c*).

While various embodiments of the present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. An imaging device comprising:
   a first semiconductor layer having a first surface and a second surface;
   a first photodetector having a first implanted region formed in the first semiconductor layer and a pad formed over the first implanted region, the pad having a malleable metallic material;
   a readout circuit disposed over the first surface of the first semiconductor layer, the readout circuit having a plurality of contact plugs facing the first surface of the first semiconductor layer, a first of the contact plugs having a first base and a first prong extending from the first base and into the malleable metallic material of the pad of the first photodetector;
   a second semiconductor layer disposed below the second surface of the first semiconductor;
   a second photodetector having a second implanted region formed in the second semiconductor layer; and
   a metalized via extending through the first semiconductor layer and the second semiconductor layer and electrically connecting the second implanted region to a second of the contact plugs of the readout circuit.

2. The imaging device of claim 1 wherein the first photodetector is operable to detect a first wavelength associated with a first portion of a predetermined band that passes through the second semiconductor layer and into the first semiconductor layer, and the second photodetector is operable to detect a second wavelength associated with a second portion of the predetermined band.

3. The imaging device of claim 2 wherein wavelengths associated with the first portion of a predetermined band are longer than wavelengths associated with the second portion of the predetermined band.

4. The imaging device of claim 1 wherein the malleable metallic material comprises Indium.

5. The imaging device of claim 4 wherein each contact plug comprises Tungsten.

6. The imaging device of claim 1 wherein the first prong of the first contact plug is one of a plurality of prongs extending from the base and into the malleable metallic material, the plurality of prongs being operable to form electrical contact with and displace a portion of the malleable metallic material into a space between the first prong and a second of the plurality of prongs.

7. The imaging device of claim 1 further comprising a first pair of stop elements, each of which is disposed over the first surface of the first semiconductor layer such that the pad of the first photodetector is disposed between the first pair of stop elements, and wherein the readout circuit has a first side and a second pair of stop elements disposed on the first side, the base of the first contact plug being affixed to the first side such that the prong of the first contact plug extends away from the first side and between the second pair of stop elements, the first pair of stop elements being disposed relative to and contacting the second pair of stop elements such that the prong of the contact plug is inhibited from passing completely through the pad of the first photodetector layer.

8. The imaging device of claim 7 wherein the imaging device further comprises a third pair of stop elements each of which is disposed over the first surface of the first semiconductor layer such that the metalized via is disposed between the third pair of stop elements, and wherein the readout circuit has a fourth pair of stop elements disposed on the first side of the readout circuit, the third pair of stop elements being disposed relative to and contacting the fourth pair of stop elements such that a prong of the second contact plug is inhibited from contacting the first surface of the first semiconductor layer.

* * * * *